United States Patent [19]
Yamazaki

[11] Patent Number: 5,879,974
[45] Date of Patent: Mar. 9, 1999

[54] METHOD OF MANUFACTURING A SEMICONDUCTOR DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 690,748

[22] Filed: Aug. 1, 1996

[30] Foreign Application Priority Data

Aug. 4, 1995 [JP] Japan .................................. 7-219559
Aug. 18, 1995 [JP] Japan .................................. 7-233305

[51] Int. Cl.⁶ .................................................. H01L 21/268
[52] U.S. Cl. ........................ 438/162; 438/166; 438/487; 438/755; 148/DIG. 16
[58] Field of Search ........................ 438/162, 166, 438/486, 487, 471, 755, 155, 184, 201; 148/DIG. 16

[56] References Cited

U.S. PATENT DOCUMENTS

| | | | |
|---|---|---|---|
| 4,220,706 | 9/1980 | Spak | 156/657 |
| 5,306,651 | 4/1994 | Masumo et al. | 437/40 |
| 5,426,064 | 6/1995 | Zhang et al. | 437/40 |
| 5,481,121 | 1/1996 | Zhang et al. | 257/64 |
| 5,488,000 | 1/1996 | Zhang et al. | 437/21 |
| 5,501,989 | 3/1996 | Takayama et al. | 437/21 |
| 5,508,533 | 4/1996 | Takemura | 257/64 |
| 5,529,937 | 6/1996 | Zhang et al. | 437/10 |
| 5,534,716 | 7/1996 | Takemura | 257/72 |
| 5,550,070 | 8/1996 | Funai et al. | 437/41 |
| 5,595,923 | 1/1997 | Zhang et al. | 437/41 |
| 5,595,944 | 1/1997 | Zhang et al. | 437/41 |
| 5,604,360 | 2/1997 | Zhang et al. | 257/72 |
| 5,605,846 | 2/1997 | Ohtani et al. | 437/21 |
| 5,606,179 | 2/1997 | Yamazaki et al. | 257/59 |
| 5,608,232 | 3/1997 | Yamazaki et al. | 257/66 |
| 5,612,250 | 3/1997 | Ohtani et al. | 437/101 |
| 5,614,426 | 3/1997 | Funada et al. | 437/40 |
| 5,614,733 | 3/1997 | Zhang et al. | 257/66 |
| 5,616,506 | 4/1997 | Takemura | 438/150 |
| 5,621,224 | 4/1997 | Yamazaki et al. | 257/66 |
| 5,624,851 | 4/1997 | Takayama et al. | 438/166 |
| 5,637,515 | 6/1997 | Takemura | 438/162 |
| 5,639,698 | 6/1997 | Yamazaki et al. | 437/228 |
| 5,643,826 | 7/1997 | Ohtani et al. | 437/88 |
| 5,646,424 | 7/1997 | Zhang et al. | 257/66 |
| 5,654,203 | 8/1997 | Ohtani et al. | 438/97 |
| 5,663,077 | 9/1997 | Adachi et al. | 438/151 |
| 5,700,333 | 12/1997 | Yamazaki et al. | 136/258 |

FOREIGN PATENT DOCUMENTS 2-140915 5/1990 Japan .
5-299810 11/1993 Japan .

OTHER PUBLICATIONS

Y. kawazu et al., Jpn. J. Appl. Phys. 29(12)(1990)2698 "Low temperature crystallization of a–Si:H induced by NiSi formation", Dec. 1990.

*Primary Examiner*—Charles L. Bowers, Jr.
*Assistant Examiner*—Leon Radomsky
*Attorney, Agent, or Firm*—Fish & Richardson P.C.

[57] ABSTRACT

Using a nickel element which is a metal element for promoting crystallized of silicon, an amorphous silicon film is crystallization into a crystalline silicon film, and then a thin film transistor (TFT) is produced by using the crystalline silicon film. That is, a solution containing nickel (for example nickel acetate solution) which promotes crystallization of silicon is applied in contact with a surface of an amorphous silicon through the spin coat method. Then the heating treatment is performed to crystallize the amorphous silicon film into the crystalline silicon film. In the state, nickel silicide components are removed using a solution containing hydrofluoric acid, hydrogen peroxide and water.

25 Claims, 8 Drawing Sheets

HEATING TREATMENT

LASER LIGHT IRRADIATING

HEATING TREATMENT

HEATING TREATMENT

LASER LIGHT IRRADIATING

IMPURITY IONS IMPLANTING AND
LASER LIGHT IRRADIATING

METHOD OF MANUFACTURING A SEMICONDUCTOR DEVICE

BACKGROUND OF THE INVENTION

1. Field of the Invention

The present invention relates to a method of manufacturing a thin-film semiconductor and a semiconductor device using the thin-film semiconductor. A thin-film transistor or a thin-film diode can be given as a device using a thin-film semiconductor to which the present invention disclosed in this specification is available.

2. Description of the Related Art

Up to now, there has been known a technique by which a thin-film transistor is formed on the surface of a glass substrate or a quartz substrate, a glass strain point of which is about 700° C. at the highest, through the vapor phase method or the like, and a thin-film transistor is manufactured using the thin-film semiconductor. There has been known a technique using an amorphous silicon film or a crystalline silicon film as the thin-film semiconductor.

In particular, a method of using the crystalline silicon film enables a high characteristic to be obtained. As a method of manufacturing the crystalline silicon film, there has been known a method of crystallizing, by heating, the amorphous silicon film formed on the glass substrate or the quartz substrate through plasma CVD or low pressure thermal CVD.

Also, as a method of lowering a heating temperature, there has been known a technique which has been disclosed in Japanese Patent Unexamined Publication No. Hei 6-244104. The technique is to reduce a heating temperature and a heating time required for the crystallization of the amorphous silicon film, using nickel, platinum, etc., which are a metal element that promotes the crystallization of silicon.

The thin-film transistor obtained by using that method can obtain the high characteristic, but suffers from problems, for example, as stated below.

The dispersion of the characteristics of the thin-film transistor obtained is large.

The characteristics of the thin-film transistor obtained are liable to be deteriorated.

An off-current value is large.

It is presumed that those problems are mainly caused by the junctions of a source and a channel, and also a drain and a channel, or a metal silicide existing in the vicinity of those junctions. In other words, it is presumed that those problems are caused by the fact that the metal silicide existing in the semiconductor is the trap level or the recombination center of electrons with holes.

SUMMARY OF THE INVENTION

The present invention is made to solve such problems that the dispersion of the characteristics of the thin-film transistor obtained is large; the characteristics of the thin-film transistor obtained is liable to be deteriorated; and an off-state current value is large.

FIGS. 3A to 3C show states in which the surface of the crystalline silicon film 500 Å in thickness which has been crystallized by heating treatment using nickel which is a metal element that promotes the crystallization of silicon has been etched by FPM. What are shown in FIGS. 3A to 3C are pictures obtained by photographing the surface of the crystalline silicon film heated at 550° C., 600° C. and 640° C., respectively, by an electron microscope. Three pictures are to show the representative states. It should be noted that a heating processing period was set to 4 hours, and the amount of introducing nickel was identical with each other between respective pictures. Also, as the method of introducing nickel, there was used a method of coating a nickel acetate solution on the surface of the amorphous silicon film through the spin coating technique.

Also, FPM is a mixed solution of hydrofluoric acid and hydrogen peroxide, and in this example, there was used solution where hydrofluoric acid, hydrogen peroxide and water are mixed together at the ratio of 0.5:0.5:99. The etching time was set to 10 minutes.

What appears holes in FIG. 3 are regions where nickel silicide was removed by FPM. This is concluded from the comparison with the observation of the surface of the crystalline silicon film obtained by merely heating without using nickel.

It is concluded from the facts shown in FIG. 3 that nickel silicide is concentrated on a specified region in the crystalline silicon film obtained by heating using nickel.

Since the nickel silicide exhibits a metal property, it causes the above-mentioned factors. That is, The dispersion of the characteristics of the thin-film transistor obtained is large.

The characteristics of the thin-film transistor obtained are liable to be deteriorated.

An off-current value is large.

In particular, the nickel silicide influences when the rough diameter of the above nickel silicide region (an equivalent diameter when the region is regarded as a grain). is 100 Å or more.

In this example, nickel silicide is used, however, it is presumed that the similar state are obtained when using other metal elements.

The present invention has been made in view of the above circumstances, and therefore an object of the present invention is to selectively remove nickel silicide components (metal silicide components) for removing any influence of those components, thereby improving the characteristic and the stability of a semiconductor device as obtained.

In order to solve the above problems, according to one aspect of the present invention, there is provided a method of manufacturing a semiconductor device, which comprises the steps of: disposing metal elements that promote the crystallization of silicon contact with in an amorphous silicon film; crystallizing the amorphous silicon film through a heat treatment; and selectively removing silicide components from the silicon film.

According to another aspect of the present invention, there is provided a method of manufacturing a semiconductor device, which comprises the steps of: disposing metal elements that promote the crystallization of silicon in contact with an amorphous silicon film; crystallizing the amorphous silicon film through a heat treatment to obtain a crystalline silicon film while forming a silicide region in the crystalline silicon film; and selectively removing the silicide region.

In the present invention described in this specification, an attention has to be paid to a method of forming a starting film to be crystallized. It is preferable that the starting film is formed of an amorphous silicon film where the content density of hydrogen is made as low as possible. This is because, if the content density of hydrogen is high, the silicide region is so moved as to stray, thereby roughening the surface of the crystalline silicon film.

According to the inventors' experiment, in the case of using the amorphous silicon film formed through the plasma CVD technique as the starting film, the amorphous silicon film is roughened as described above. This is because a large amount of hydrogen is contained in the amorphous silicon film formed through plasma CVD.

In order to solve this problem, the heat treatment is conducted on the amorphous silicon film formed through the plasma CVD technique at 450° to 600° C. for about 1 to 4 hours so that hydrogen in the film is sufficiently discharged to the exterior. The heat treatment for discharging hydrogen need be conducted under the condition where the amorphous silicon film is not crystallized.

Also, it is available to use an amorphous silicon film made from disilane ($Si_2H_6$) as a raw gas through LPCVD (low pressure thermal CVD). Since the amorphous silicon film formed through the LPCVD technique is fundamentally low in the content of hydrogen in the film, any problems caused by the above-mentioned crystallization can be solved.

In the present invention described in this specification, it is preferable that the thickness of the crystalline silicon film as obtained is 1000 Å or less. This is because the thick film makes it hard to remove the silicide components which exist in the interior of the film so as not to be exposed. It should be noted that the lower limit of the film thickness is determined in accordance with how the starting film can be thinned. Since it is generally difficult to form the amorphous silicon film uniformly to 100 Å or less, the lower limit of the film thickness becomes 100 Å.

It should be noted that, since the thickness of the amorphous silicon film is not remarkably changed even though the amorphous silicon film is crystallized, the thickness of the crystalline silicon film may be regarded as the thickness of the amorphous silicon film. As a result, it is preferable that the thickness of the amorphous silicon film that forms the starting film is set to 100 to 1000 Å.

Moreover, similarly in order to obtain the annealing effect by the irradiation of a laser beam, it is preferable that the thickness of the amorphous silicon film is set to 100 to 1000 Å.

It should be noted that, since the surface of the silicon film is roughened with the irradiation of a laser beam, the film thickness may be roughly estimated by the average thickness in the case where the roughness is made even.

Also, the temperature of the heat treatment can be selected from 450° to 1100° C. In particular, it is useful to set the temperature to be high, that is, 800° C. or higher from the viewpoint of obtaining a high crystallinity. However, the heating temperature need be determined in view of the heat resistance of the substrate as used.

Furthermore, in the present invention described in this specification, a large effect can be obtained when the rough diameter of the silicide region is 100 Å or more. This is because, when the size of the silicide region becomes about 100 Å or more in diameter, it influences remarkably. A hydrofluoric acid based solution can be widely used as an etchant that selectively removes the silicide region. It is available to use the solution that the etching rate of metal silicide is much larger than that of the silicon.

In the present invention described in this specification, what are available as the metal element that promotes the crystallization of silicon can be one kind of element or plural kinds of elements selected from Fe, Co, Ni, Ru, Rh, Pd, Os, Ir, Pt, Cu and Au. Also, the metal elements are required that the finally remain concentration is $1 \times 10^{15}$ to $5 \times 10^{19}$ atms $cm^{-3}$.

Also, as a method of introducing the metal elements, it is preferable to use a solution containing the metal elements therein. This method of using the solution has an availability that the metal elements can be held in uniform contact with the surface of the amorphous silicon film since the metal elements can be provided in the form of a film.

Furthermore, that method has a remarkable feature that the density of the metal elements is readily adjusted. The density of the metal elements that promote the crystallization of silicon in the silicon film is made as low as possible. Hence, to adjust the amount of the metal elements to be introduced is of a very important technique.

Moreover, the method of using that solution has a remarkable feature that, since the metal elements can be held in uniform contact with the surface of the amorphous silicon film in the form of a film, crystal growth can be progressed uniformly.

Hereinafter, the method of using such a solution will be described.

In the case of using nickel as a metal element that promotes the crystallization of silicon, a solution can be used which contains at least one kind of nickel compound selected from nickel bromide, nickel acetate, nickel oxalate, nickel carbonate, nickel chloride, nickel iodide, nickel nitrate, nickel sulfate, nickel formate, nickel acetylacenate, nickel 4-cyclohexyl butyrate, nickel oxide, nickel hydroxide, and nickel 2-ethyl hexanoic acid.

Also, Ni may be mixed with at least one selected from benzene, toluene, xylene, carbon tetrachloride, chloroform, ether, trichloroethylene, or fleon, all of which are non-polar solvents.

In the case of using Fe (iron) as a metal element that promotes the crystallization of silicon, a compound known as ion salt, for example, at least one kind of material selected from iron (I) bromide ($FeBr_2$ $6H_2O$), iron (II) bromide ($FeBr_3$ $6H_2O$), iron (II) acetate ($Fe(C_2H_3O_2)_3 xH_2O$), iron (I) chloride ($FeCl_2$ $4H_2O$), iron (II) chloride ($FeCl_3$ $6H_2O$), iron (II) fluoride ($FeF_3$ $3H_2O$), iron (II) nitrate ($Fe(NO_3)_3$ $9H_2O$), iron (I) phosphorate ($Fe_3(PO_4)_2$ $8H_2O$), and iron (II) phosphorate ($FePO_4$ $2H_2O$) can be used.

In the case of using Co (cobalt) as a metal element that promotes the crystallization of silicon, a compound known as a cobalt salt, for example, a material selected from cobalt bromide ($CoBr$ $6H_2O$), cobalt acetate ($Co(C_2H_3O_2)_2$ $4H_2O$), cobalt chloride ($CoCl_2$ $6H_2O$), cobalt fluoride ($CoF_2$ $XH_2O$), and cobalt nitrate ($Co(No_3)_2$ $6H_2O$) can be used.

In the case of using Ru (ruthenium) as a metal element that promotes the crystallization of silicon, a compound known as ruthenium salt, for example, ruthenium chloride ($RuCl_3H_2O$) can be used.

In the case of using Rh (rhodium) as a metal element that promotes the crystallization of silicon, a compound known as a rhodium salt, for example, rhodium chloride ($RhCl_3$ $3H_2O$) can be used.

In the case of using Pd (palladium) as a metal element that promotes the crystallization of silicon, a compound known as a palladium salt, for example, palladium chloride ($PdCl_2 2H_2O$) can be used.

In the case of using Os (osmium) as a metal element that promotes the crystallization of silicon, a compound known as osmium salt, for example, osmium chloride ($OSCl_3$) can be used.

In the case of using Ir (iridium) as a metal element that promotes the crystallization of silicon, a compound known as iridium salt, for example, a material selected from iridium trichloride ($IrCl_3$ $3H_2O$) and iridium tetrachloride ($IrCl_4$) can be used.

In the case of using Pt (platinum) as a metal element that promotes the crystallization of silicon, a compound known as platinum salt, for example, platinum (II) chloride (PtCl$_4$ 5H$_2$O) can be used.

In the case of using Cu (copper) as a metal element that promotes the crystallization of silicon, a material selected from copper (II) acetate (Cu(CH$_3$COO)$_2$), copper (II) chloride (CuCl$_2$ 2H$_2$O) and copper (II) nitrate (Cu(NO$_3$)$_2$ 3H$_2$O) can be used as its compound.

In the case of using gold (Au) as a metal element that promotes the crystallization of silicon, a material selected from gold trichloride (AuCl$_3$ xH$_2$O) and gold nitride (AuHCl$_4$ 4H$_2$O) can be used as its compound.

DETAILED DESCRIPTION OF THE PREFERRED EMBODIMENTS

First Embodiment

FIGS. 1A to 1E and 2A to 2F show a process of manufacturing a thin-film transistor in accordance with a first embodiment.

First, a silicon oxide film 102 having a thickness of 3000 Å is formed as an undercoating film on a glass substrate 101 through plasma CVD.

For example, a Coning 7059 glass substrate or a Coning 1737 glass substrate is appropriately used as the glass substrate.

The Coning 7059 glass substrate has an availability that it is inexpensive. Also, it can be optically satisfactorily used for a liquid-crystal electro-optical device. However, since the strain point is 593° C., there arises such a problem that the glass substrate cannot be heated at 593° C. or higher.

A silicon oxide film 102 formed on a glass substrate 101 serves to prevent a stress from being exerted between the glass substrate 102 and a silicon film which will be formed later, and also to prevent impurities from being diffused from the glass substrate 101 side.

Next, an amorphous silicon film 103 having a thickness of 500 Å is formed on the silicon oxide film 102 through plasma CVD or low pressure thermal CVD. In this example, the amorphous silicon film 103 is formed on the silicon oxide film 102 through LPCVD using disilane (Si$_2$H$_6$) containing diborane (B$_2$H$_6$) of 3 ppm therein. The film forming temperature is 450° C. The film forming temperature may be selected from about 450° to 500° C. Also, it is preferable that the thickness of the amorphous silicon film 103 is from 100 to 1000 Å.

Diborane is added to disilane in order to control a threshold value of a thin-film transistor which will be described later. Also, its density may be selected from a range of 1 to 5 ppm.

Furthermore, although not shown, a very thin oxide film is formed on the surface of the amorphous silicon film 103 through UV oxidation. The oxide film has an action of improving the wettability for a solution which will be coated later. This is a method of irradiating a UV ray onto the surface of the amorphous silicon film 103 under the oxidized atmospheres to form an oxide film.

Figure 1A:
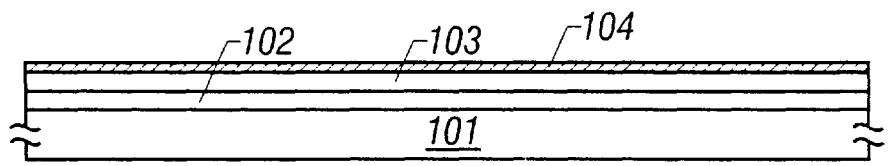
FIGS. 1A to 1E show a process of manufacturing a crystalline silicon film.

Subsequently, a nickel acetate solution adjusted to a predetermined concentration is coated on the surface of the amorphous silicon film 103 through spin coating, to thereby form a film 104 containing nickel therein. Nickel elements need be so adjusted that the concentration of the nickel elements finally remaining in the obtained crystalline silicon film (FIG. 1B) becomes within from $1\times10^{15}$ to $5\times10^{19}$ atms cm$^{-3}$ as the minimum value based on the measurement of SIMS (secondary ion mass spectroscopy) (FIG. 1A).

Figure 1B:
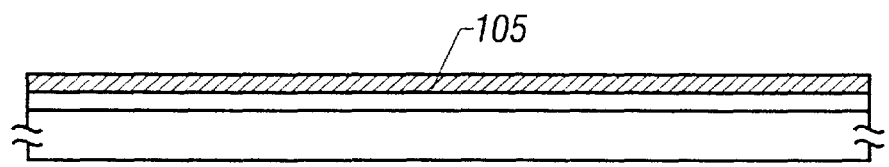

Then, a heating treatment is performed on the amorphous silicon film 103 under the nitrogen atmosphere at 550° C. for 4 hours, to thereby crystallize the amorphous silicon film 103 into a crystalline silicon film 105. The heating temperature need be set to about 450° to 700° C. The temperature need be set to a temperature as high as possible in a range where the heat resistance of the glass substrate as used is permitted (FIG. 1B).

Figure 1C:
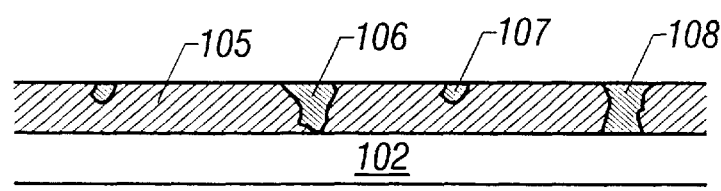

What is shown in FIG. 1C is a state where nickel silicide indicated by reference numerals 106 to 108 are formed in the crystalline silicon film 105.

Figure 1D:
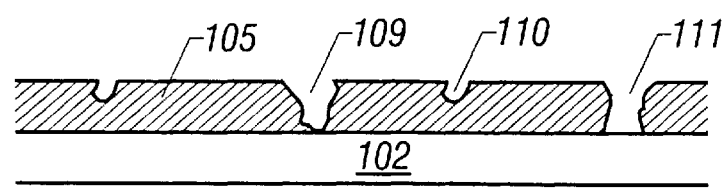

In this example, etching is performed using the above-mentioned FPM for 5 minutes. As a result, nickel silicide components are removed, thereby defining apertures or holes indicated by reference numerals 109 to 111 in the crystalline silicon film 105 (FIG. 1D).

Furthermore, as occasion demands, a laser beam is irradiated on the crystalline silicon film 105 in order to close the holes indicated by reference numerals 109 to 111. Although all the holes are not closed, small holes can be closed by the irradiation of the laser beam by setting conditions appropriately. Also, any influence caused by the existence of the holes can be reduced. In this way, the crystalline silicon film 112 can be formed on the glass substrate 101.

Figure 2A:
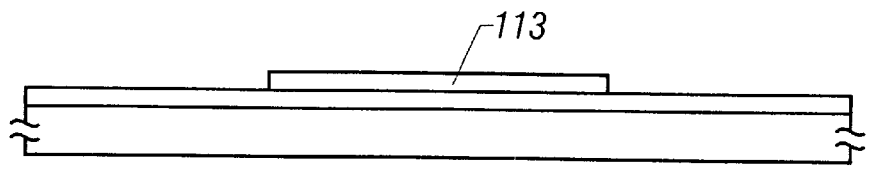
FIGS. 2A to 2F show a process of manufacturing a thin-film transistor using a crystalline silicon film.

Subsequently, as shown in FIG. 2A, an active layer 113 of the thin-film transistor can be formed by patterning. Further, a silicon oxide film 114 that functions as a gate insulated film having a thickness of 1000 Å is formed through plasma CVD. Moreover, an aluminum film (not shown) containing 0.2 wt % of scandium is formed thereon through sputtering.

After the formation of the aluminum film, a fine anodic oxide film 115 having a thickness of about 200 Å is formed on the aluminum film. The anodic oxidation is performing with the aluminum film as an anode using an ethylene glycol solution containing tartaric acid as electrolyte. The fine anodic oxide film 115 plays an important role in order to improve the adhesion with a resist mask used for patterning the gate electrode.

Figure 2B:
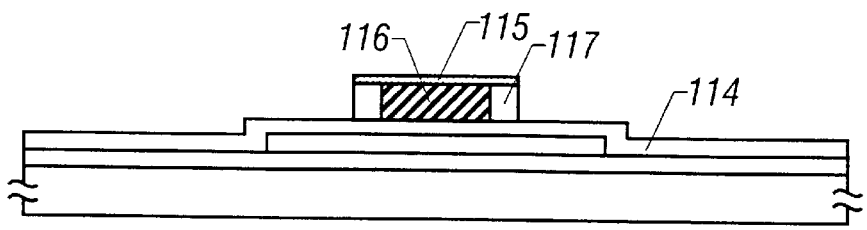

Subsequently, using a resist mask not shown, a gate electrode 116 is formed. Then, a second anodic oxidation is performed to the gate electrode 116 in an electrolyte containing citric acid therein. A porous anodic oxide film 117 is formed. The thickness of the anodic oxide film 117 is 5000 Å (FIG. 2B).

Figure 2C:
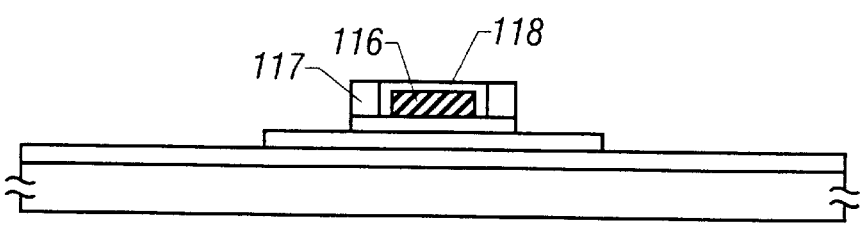

Then, the resist mask not shown and the fine anodic oxide film 115 are removed, and a fine anodic oxide film 118 is formed. In this process, since the electrolyte enters the porous anodic oxide film 117, the anodic oxide film 118 is formed. The thickness of the fine anodic oxide film 118 is set to 500 Å. The anodic oxide film 118 plays an important role in order to restrain the occurrence of hillock (sharp or needle-shaped protrusion) or the occurrence of cracks which are caused by abnormal growth of aluminum (FIG. 2C).

Figure 2D:
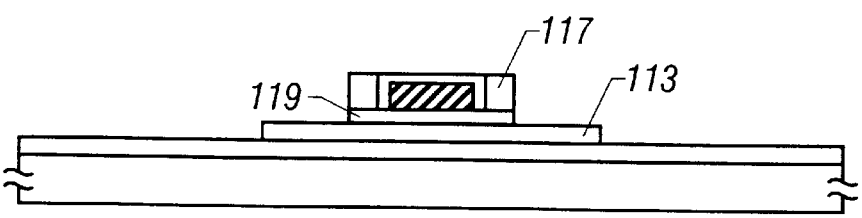

Subsequently, an exposed silicon oxide film 114 is removed by the etching method having a vertically anisotropy. In this way, a state shown in FIG. 2D is obtained. In this process, a part of an active layer 113 is exposed.

Figure 2E:
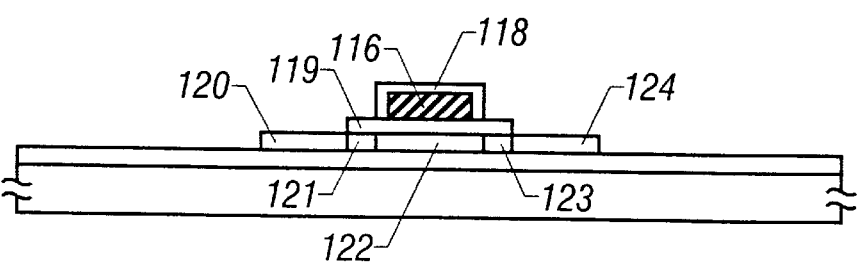

Then, the porous anodic oxide film 117 are removed. In this way, this state shown in FIG. 2E is obtained, then impurity ions are implanted in order to give one conductive type. In this example, P (phosphorus) ions are implanted in order to manufacture an n-channel thin-film transistor.

In this process, a source region 120 and a drain region 124 are formed in a self-aligned manner. Also, with the existence of a remaining gate insulated film 119, low-density impurity regions 121 and 123 where the concentration of p ions to be implanted is reduced are formed. Also, a channel formation region 122 is formed simultaneously. In this example, a region indicated by reference numeral 123 at a drain region 124 side becomes a region called "an LDD (light doped drain) region" (FIG. 2E).

After the completion of the implantation of impurity ions, a laser beam is irradiated on the regions to activate the region where impurity ions have been implanted.

Figure 2F:
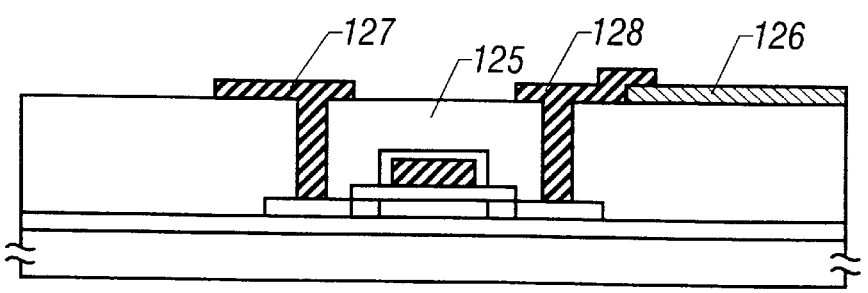
Figure 3A:
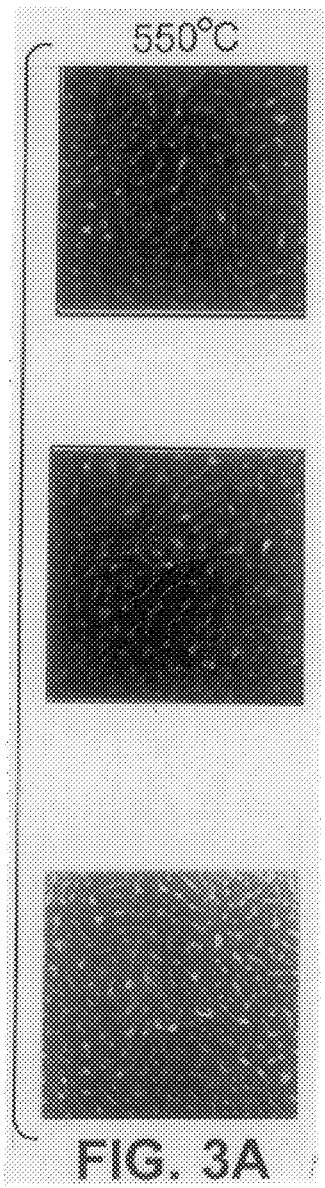
FIGS. 3A to 3C show states of the surface of the crystalline silicon film.
Figure 3B:
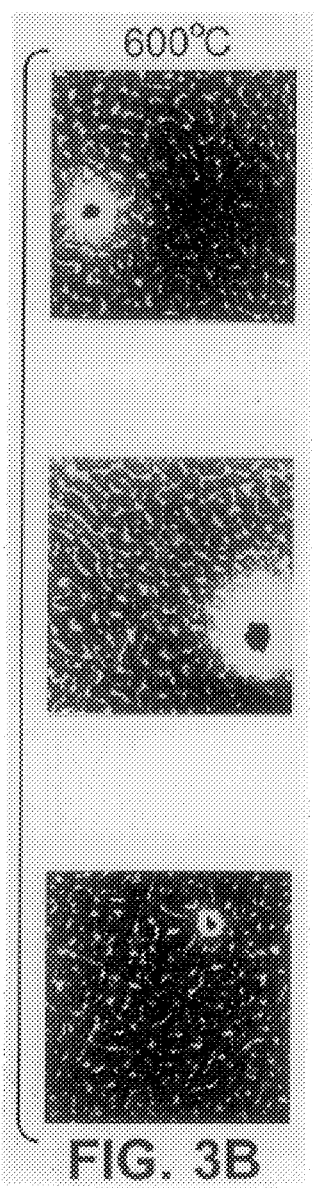
Figure 3C:
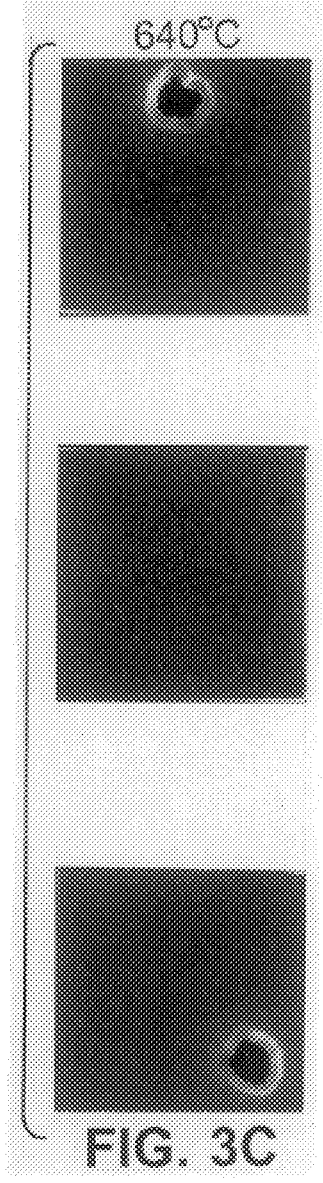

Then, an interlayer insulating film 125 having a thickness of 6000 Å is formed through plasma CVD. Then, an ITO electrode 126 that forms a pixel electrode is formed. Furthermore, after the formation of contact holes, a source electrode wiring 127 and a drain electrode wiring 128 are formed as a laminate film consisting of a titanium film, an aluminum film and a titanium. In this way, a thin-film transistor disposed in a pixel region of an active matrix liquid-crystal display unit shown in FIG. 2F is completed.

Figure 7:
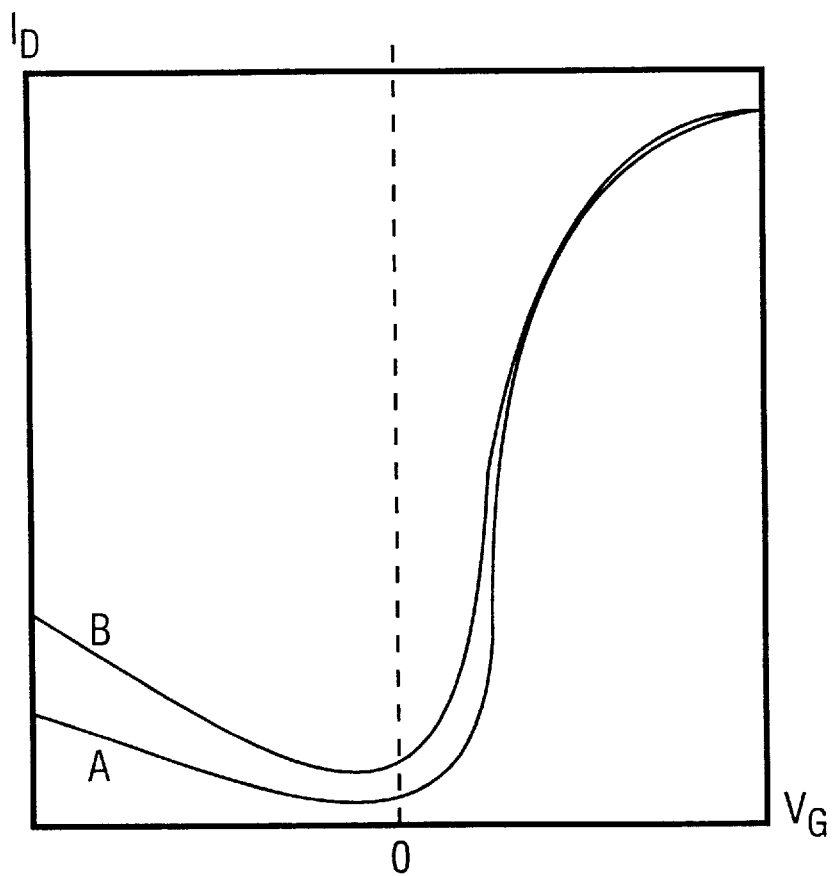
FIG. 7 shows an example of the characteristic of a thin-film transistor.

A symbol A in FIG. 7 shows an example of the characteristic of a thin-film transistor obtained in accordance with the manufacturing process of this embodiment. Also, a symbol B in FIG. 7 shows the characteristic example of a thin-film transistor in the case where nickel silicide components indicated by reference numerals 106 to 108 have not been removed in the manufacturing process of this embodiment.

As shown in FIG. 7, a reason why an off-state current value can be reduced is that the movement of carriers at the time of the off operation which is caused by the nickel silicide components can be restrained.

Also, in the case of applying the structure of this embodiment, the dispersion or the deterioration of the characteristic can be largely restrained. Moreover, since the crystalline silicon film can be obtained at a low temperature of 550° C., for a short period of time of 4 hours and an inexpensive large-area glass substrate can be used. This is a large effect in comparison with the conventional method required heating at a temperature of 600° C. or higher for 20 hours or longer.

As described above, with the application of the structure shown in this embodiment, there can be obtained the following advantages simultaneously.

A high crystalline silicon film can be obtained with a heat treatment at a low temperature for a short period of time The characteristic and the reliability of the semiconductor device as obtained can be enhanced.

Second Embodiment

FIGS. 4A to 4E show a process of manufacturing a thin-film transistor in accordance with a second embodiment.

First, a silicon oxide film 102 having a thickness of 3000 Å is form ed as an undercoating film on a glass substrate 101 through plasma CVD. Similarly, in this embodiment, for example, a Coning 7059 glass substrate or a Coning 1737 glass substrate can be used as the glass substrate.

Figure 4A:
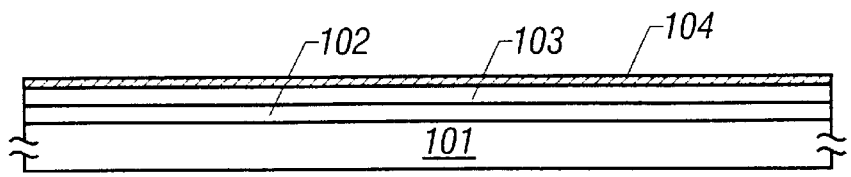
FIGS. 4A to 4F show a process of manufacturing a crystalline silicon film.

Next, an amorphous silicon film 103 having a thickness of 500 Å is formed on the silicon oxide film 102 through plasma CVD or low pressure thermal CVD. Further, the nickel acetate solution adjusted to a predetermined concentration is coated through spin coating, to thereby form a nickel film or film 104 containing nickel therein (FIG. 4A).

Figure 4B:
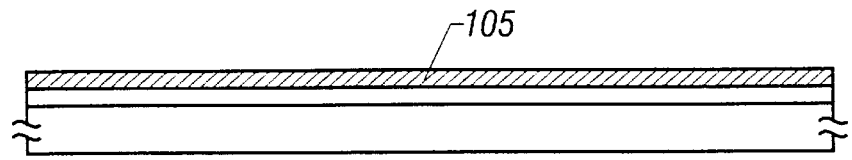

Then, a heating treatment is per formed to the amorphous silicon film 103 under the nitrogen atmosphere at 550° C. for 4 hours, to thereby crystallize the amorphous silicon film 103 into a crystalline silicon film 105 (FIG. 4B).

Figure 4C:
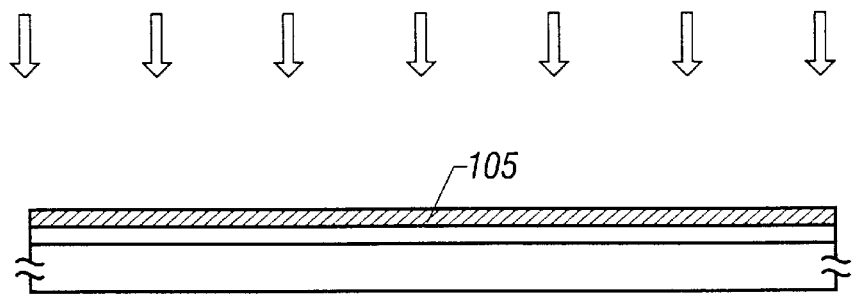

Further, as shown in FIG. 4C, a laser beam is irradiated on the crystalline silicon film 105, to thereby improve the crystallinity of the crystalline silicon film 105. In this example, KrF excimer laser is irradiated thereon with an energy density of 350 mJ/cm$^2$.

Figure 4D:
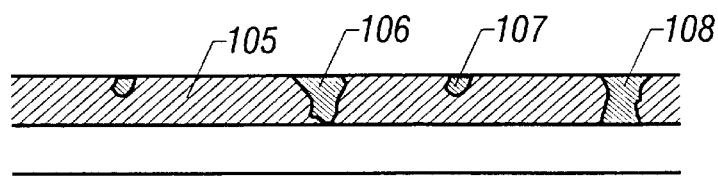

In this state, as shown in FIG. 4D, nickel silicide 106 to 108 are formed in the crystalline silicon film 105.

Figure 4E:
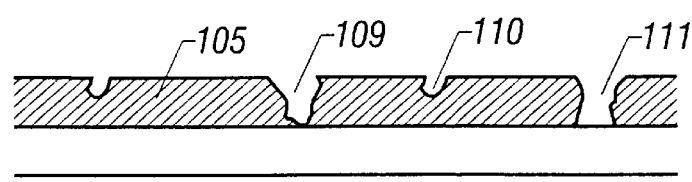

In this example, etching is performed using the above-mentioned FPM for 5 minutes. As a result, nickel silicide components are removed, thereby defining apertures or holes indicated by reference numerals 109 to 111 in the crystalline silicon film 105 (FIG. 4E).

Figure 4F:
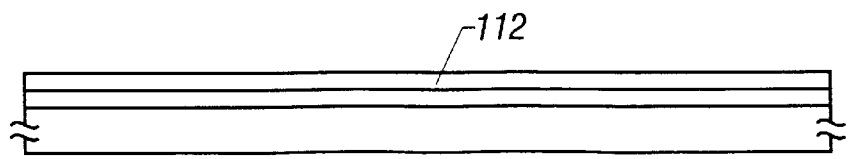

In this manner, the crystalline silicon film 112 can be formed on the glass substrate 101 (FIG. 4F).

Third Embodiment

FIGS. 5A to 5F show a process of manufacturing a crystalline silicon film in accordance with a third embodiment.

First, a silicon oxide film 102 having a thickness of 3000 Å is formed as an undercoating film on a glass substrate 101 through plasma CVD.

Figure 5A:
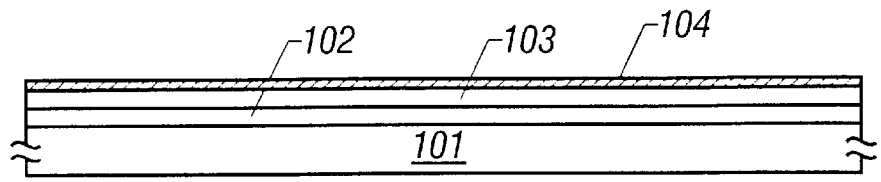
FIGS. 5A to 5F show a process of manufacturing a crystalline silicon film.

Next, an amorphous silicon film 103 having a thickness of 500 Å is formed on the silicon oxide film 102 through plasma CVD or low pressure thermal CVD. Further, the nickel acetate solution adjusted to a predetermined concentration is coated through spin coating, to thereby form a film 104 containing nickel therein (FIG. 5A).

Figure 5B:
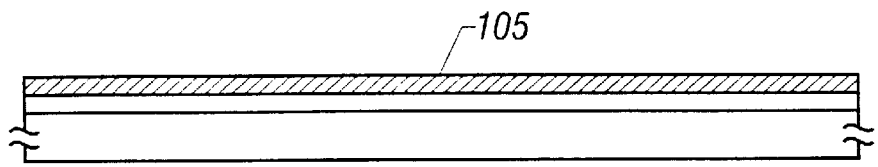

Then, a heating treatment is performed to the amorphous silicon film 103 under the nitrogen atmosphere at 550° C. for 4 hours, to thereby crystallize the amorphous silicon film 103 into a crystalline silicon film 105 (FIG. 5B).

Figure 5C:
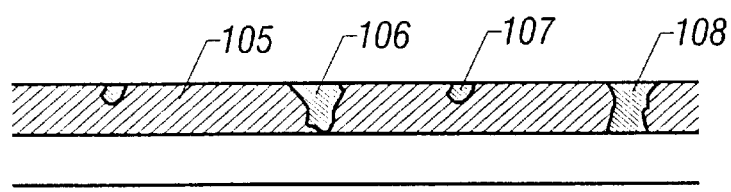

In this state, as shown in FIG. 5C, nickel silicide components 106 to 108 are formed in the crystalline silicon film 105.

Figure 5D:
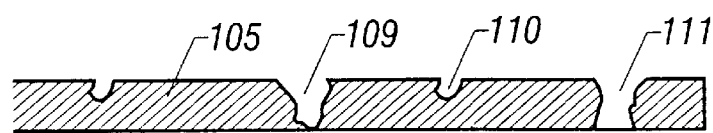

In this example, etching is performed using the above-mentioned FPM for 5 minutes. As a result, nickel silicide components are removed, thereby defining apertures or holes indicated by reference numerals 109 to 111 in the crystalline silicon film 105 (FIG. 5D).

Figure 5E:
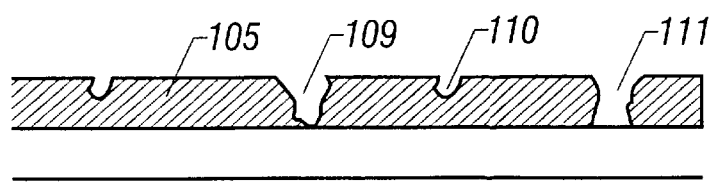

After nickel silicide components 106 to 108 has been removed, a heating treatment at 550° C. for 2 hours is performed (FIG. 5E).

With the conduction of the heating treatment, defects caused by the removal of the nickel silicide components can be annealed. Also, a dangling bond may be positively neutralized under the hydrogen atmosphere or the atmosphere containing 50 volume % or more of hydrogen during this process.

Figure 5F:
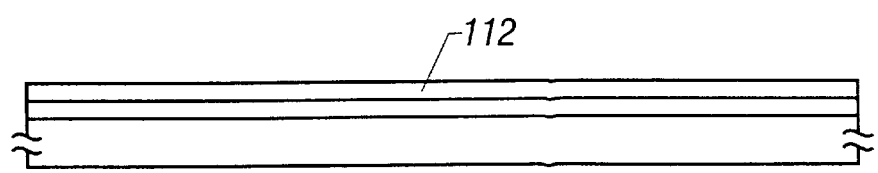

In this way, the crystalline silicon film 112 can be formed on the glass substrate 101 (FIG. 5F).

In the subsequent process, a thin-film transistor or other thin-film semiconductor device may be manufactured using the crystalline silicon film 112.

Fourth Embodiment

FIGS. 6A to 6F show a process of manufacturing a crystalline silicon film in accordance with a fourth embodiment.

First, a silicon oxide film 102 having a thickness of 3000 Å is formed as an undercoating film on a glass substrate 101 through plasma CVD.

Figure 6A:
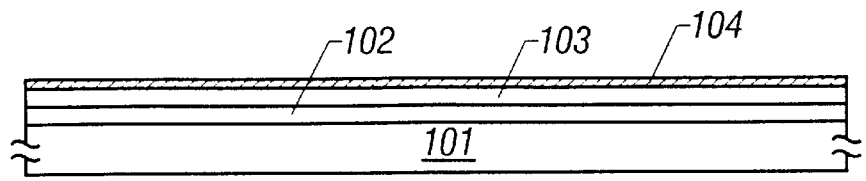
FIGS. 6A to 6F show a process of manufacturing a crystalline silicon film.

Next, an amorphous silicon film 103 having a thickness of 500 Å is formed on the silicon oxide film 102 through plasma CVD or low pressure thermal CVD (FIG. 6A).

Figure 6B:
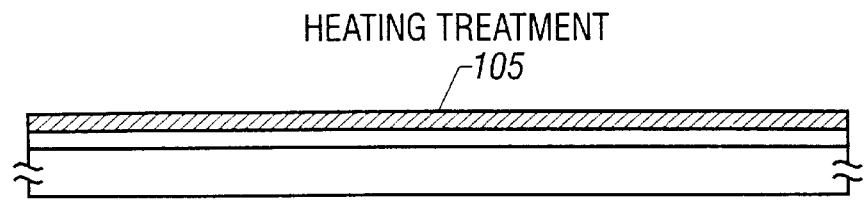

Then, a heating treatment is performed on the amorphous silicon film 103 under the nitrogen atmosphere at 550° C. for 4 hours, to thereby crystallize the amorphous silicon film 103 into a crystalline silicon film 105 (FIG. 6B).

Figure 6C:
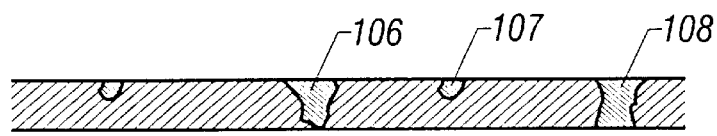

In this state, as shown in FIG. 6C, nickel silicide indicated by reference numerals 106 to 108 are formed in the crystalline silicon film 105.

Figure 6D:
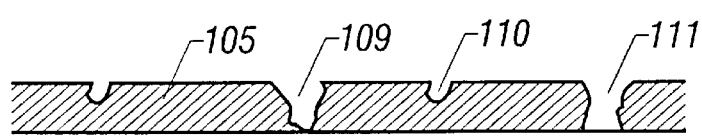

In this example, etching is performed using the above-mentioned FPM for 5 minutes. As a result, nickel silicide components are removed, thereby defining apertures or holes 109 to 111 in the crystalline silicon film 105 (FIG. 6D).

Figure 6E:
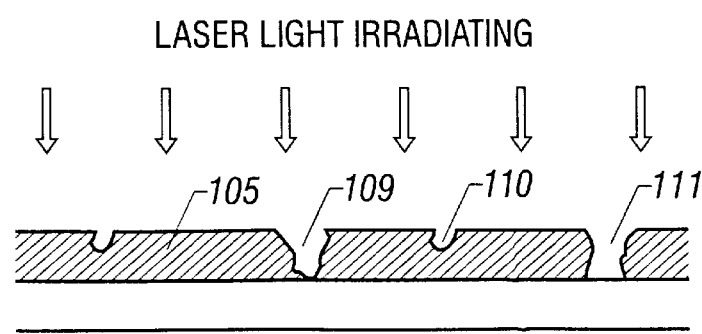

After nickel silicide components indicated by reference numerals 106 to 108 has been removed, a heat treatment at 550° C. for 2 hours is conducted (FIG. 6E).

In this example, KrF excimer laser beam is irradiated with the energy density of 400 MJ/cm$^2$. A laser beam is so irradiated as to close small holes. Also, any influence caused by the existence of the holes can be almost completely suppressed. The irradiation of the laser beam allows the crystallinity of the entire film to be further enhanced. Furthermore, the enhancement of the irradiation energy of a laser beam allows the surface of the silicon film to be melted and recrystallized with the irradiation of the laser beam.

With the irradiation of the laser beam, there can be obtained such a significant effect that the crystallinity of a film is enhanced, and the holes formed in the film can be closed. On the other hand, there arise problems stated below.

A first problem is that impurities are taken in the film (in particular, the uppermost surface of the film) from the atmosphere when the surface of the film is instantaneously melted. A second problem is that the impurities are deposited on the surface of the film. It is presumed that this is caused by such a mechanism that the irradiation of the laser beam makes the film in a melting state, and the film is then cooled from its surface. In other words, the impurities are selectively deposited on the surface of the film which is cooled and crystallized.

Most of the deposited impurities are heavy metal in this embodiment, nickel used for crystallization (there also exist a large amount of nickel elements which are not converted into silicide to the remarkable degree).

In order to solve the above problems, according to this invention, the surface of the crystalline silicon film is slightly etched. In this example, there is used HNO$_3$ (60%) —HF(<0.2%)—H$_2$O solution having low HF concentration. This solution is to be used for cleaning the surface of a silicon wafer and has a characteristic of slightly etching a crystalline silicon film and in particular of effectively removing a heavy metal.

Figure 6F:
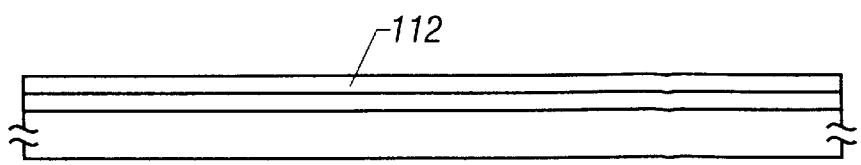

Upon cleaning the crystalline silicon film using the above solution, the heavy metal or other impurities existing on the surface of the crystalline silicon film, in particular its uppermost surface can be removed, thereby being capable of obtaining a crystalline silicon film excellent in electrical characteristic. In this way, the crystalline silicon film 112 can be formed on the glass substrate 101 (FIG. 6F).

Also, the above cleaning process may be performed at a stage before the irradiation of a laser beam. Also, it may be utilized in the case where a laser beam is not irradiated.

Fifth Embodiment

A fifth embodiment is characterized in that the under layer 102 is formed of a laminate layer consisting of a silicon oxide film and a nitrogen silicon film in the structure shown in FIG. 1. The etching rate of FPM where hydrofluoric acid, hydrogen peroxide and water are mixed together at the ratio of 0.5:0.5:99 is that the silicon oxide film is roughly 30 to 40 Å/min, a monocrystal silicon film is 1 to 2 Å/min, nickel silicide or other metal silicide is several hundreds Å/min or more, and a silicon nitride film is 3 to 5 Å/min.

Hence, in the case of using the silicon oxide film as the undercoating film 102, over-etching is progressed, and the under layer may be largely scooped out.

In view of this, in this embodiment, the silicon nitride film having the same etching rate as that of silicon (in this case, monocrystal silicon) is formed as the uppermost surface of the under layer, to thereby restrain the scooping of the under layer in progressing over-etching.

An example of a specific structure of the underlayer in this embodiment is a laminate structure having a silicon oxide film 3000 Å in thickness and a silicon nitride film 300 Å in thickness. A silicon oxynitride film may be used instead of the silicon nitride film. Also, a mono-layer film of the silicon oxynitride film may be used as the under layer. The method of forming the silicon nitrogen oxidation film is through plasma CVD, TEOS gas and N$_2$O gas may be used as a gas source.

Sixth Embodiment

A sixth embodiment is an example in which, in the structure shown in the first embodiment, the conditions for the heat treatment is 650° C. and 4 hours. Where the heating temperature is 650° C., it is necessary to use, a glass substrate having a high heat resistance such as Coning 1737 glass substrate having a strain point of 667° C. In the case of using the glass substrate having such a high heat resistance, the heating temperature can be about 580° to 670° C.

In the case of going up the heating temperature for crystallization to 650° C. as shown in this embodiment, a higher crystallinity can be obtained.

Seventh Embodiment

A seventh embodiment is an example in which platinum (II) chloride (PtCl$_4$5H$_2$O) is used instead of nickel acetate salt. In this case, platinum is used as a metal element that promotes the crystallization of silicon. Even in the case of using platinum, the same effect as that in the case of using nickel can be obtained.

Eighth Embodiment

An eighth embodiment is characterized in that a quartz substrate is used as a substrate, and a heat treatment for obtaining the crystalline silicon film is performed at a high temperature such as 800° to 1100° C. Referring to FIG. 1, the structure for obtaining the crystalline silicon film will be first described.

In this example, a quartz substrate is used which withstands the heat treatment at a high temperature up to about 1100° C. First, a silicon oxide film 102 having a thickness of 5000 Å is formed on the quartz substrate 101 in FIG. 1 as an under layer through plasma CVD. In the case of using the quartz substrate, since the coefficient of thermal expansion is different between the quartz substrate and the silicon film, it is useful that the silicon oxide film 102 as a stress buffer layer is formed to the thickness of 5000 Å therebetween.

Then, an amorphous silicon film 103 is formed to the thickness of 500 Å through LPCVD. Furthermore, a very thin oxide film (not shown) is formed through UV oxidation, and further a nickel acetate solution adjusted to a predetermined concentration is coated thereon through spin coating, to thereby form a film 104 containing nickel therein (FIG. 1A).

Then, a heat treatment is performed at 800° C. for four hours to obtain a crystalline silicon film 105. The heating temperature can be selected from 800° to 1100° C. As the heating temperature is high, the crystallinity of the crystalline silicon film as obtained can be enhanced. In this example, the heat treatment is performed at a temperature of 800 Å from the economical viewpoints (FIG. 1B).

As described in this embodiment, upon performing the heating treatment at a high temperature, a very high crystallinity can be obtained by using a nickel element. This crystallinity is very high which cannot be obtained simply by the heat treatment or the irradiation of a laser beam. However, even in this case, the lumps of nickel silicide are locally formed as indicated by reference numerals 106 to 108 in FIG. 1C.

Therefore, even in this embodiment, the nickel silicide components are removed using FPM. With the removal of the nickel silicide components of FPM, holes indicated by reference numerals 109 to 111 in FIG. 1D are formed.

Furthermore, as occasion demands, a laser beam is irradiated to close the holes. Also, after the irradiation of a laser beam, cleaning is performed using an $HNO_3$ (60%) —HF (<0.2%) —$H_2O$ solution having low HF concentration to remove the heavy metal component from the exposed surface of the crystalline silicon.

Figure 1E:
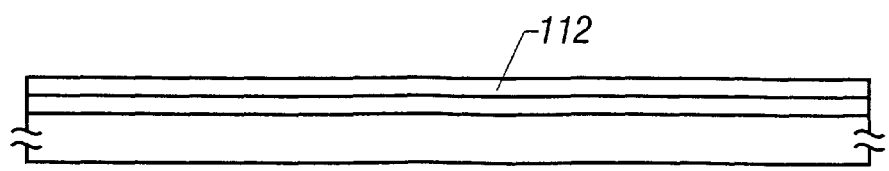

In this way, a crystalline silicon film 112 having a high crystallinity on the quartz substrate 101, and removing the influence of the nickel silicide component is obtained FIG. 1E).

Figure 8A:
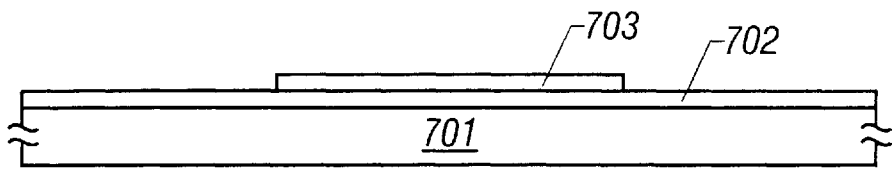
FIGS. 8A to 8D show a process of manufacturing a thin-film transistor using a crystalline silicon film.

Thereafter, with the patterning of the crystalline silicon film, there is obtained an active layer 703 of the thin-film transistor as shown in FIG. 8A. In FIG. 8A, reference numeral 701 denotes a quartz substrate, and 702 is a silicon oxide film of the under layer.

Figure 8B:
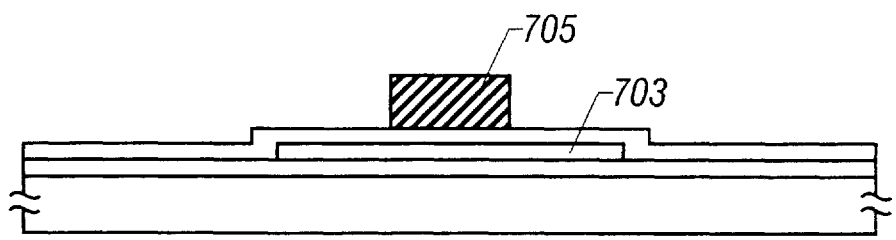

Upon obtaining the state shown in FIG. 8A, a gate electrode 705 is formed by chrome silicide molybdenum silicide or silicon which is doped with impurities giving one conductivity type. In this example, a gate electrode 705 is formed by molybdenum silicide. It should be noted that the gate electrode need be made of a material that withstands the subsequent heating treatment process (FIG. 8B).

Figure 8C:
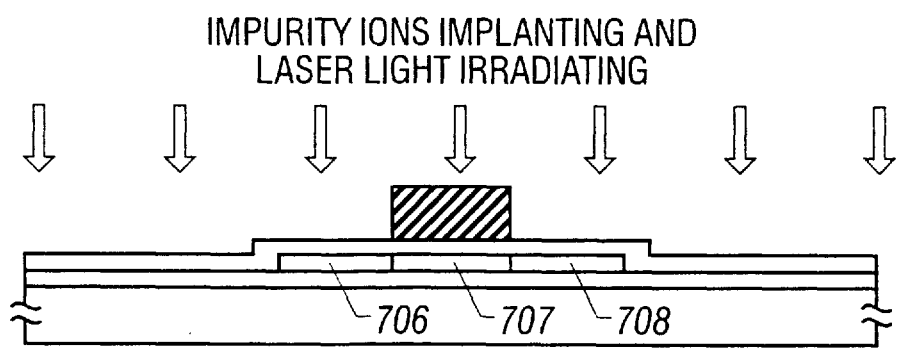

Then, as shown in FIG. 8C, P (phosphorus) ions which are impurities giving one conductivity type are implanted through plasma doping. In this process, a source region 706, a drain region 708 and a channel formation region 707 are formed in a self-aligned manner (FIG. 8C).

Then, a heating treatment at 850° C. for 2 hours is performed to activate a region into which impurity ions are implanted.

Figure 8D:
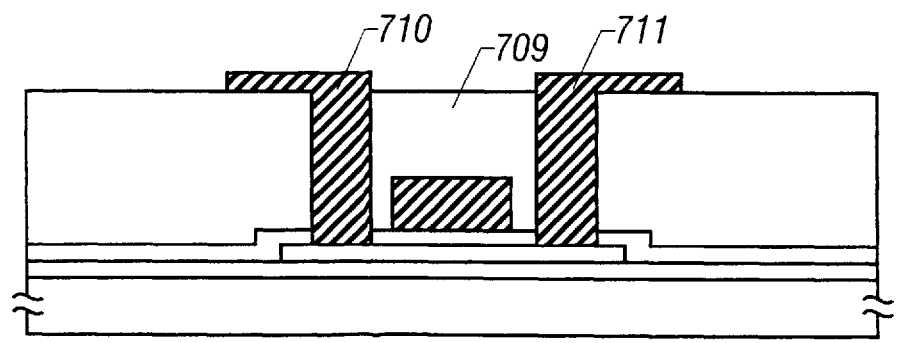

Furthermore, an interlayer insulating film 709 is a laminate film consisting of a silicon oxide film or a silicon nitride film and a silicon oxide film. Then, contact holes are made to form a source electrode 710 and a drain electrode 711. In this example, a laminate film containing a titanium film, an aluminum film and a titanium film is used the source electrode and the drain electrode. It is needless to say that the source and drain electrodes can be made of an appropriate electrically conductive material (FIG. 8D).

The crystalline silicon film obtained using the metal element that promotes the crystallization of silicon is etched to electively remove silicide of the metal element, thereby being capable of removing the influence of the metal element.

Then, the thin-film transistor manufactured by the crystalline silicon film which is obtained by using the metal element that promotes the crystallization of silicon can solve the problems stated below:

The dispersion of the characteristics of the thin-film transistor obtained is large.

The characteristics of the thin-film transistor obtained are liable to be deteriorated.

An off-current value is large.

What is claimed is:

1. A method for producing a semiconductor device comprising the steps of:
   disposing a metal element which promotes crystallization of silicon in contact with an amorphous silicon film;
   crystallizing the amorphous silicon film by heating to obtain a crystalline silicon film having a silicide region;
   selectively removing the silicide region from the crystalline silicon film without etching the crystalline silicon film to leave a hole in the crystalline silicon film thereafter; and
   closing said hole by irradiating an entire surface of the crystalline silicon film with a laser light.

2. The method of claim 1 wherein the metal element comprises at least one of Fe, Co, Ru, Rh, Pd, Os, Ir, Pt, Cu and Au.

3. The method of claim 1 wherein the metal element comprises Ni and the silicide region comprises nickel silicide.

4. The method of claim 1 wherein the amorphous silicon film is formed over at least a film comprising silicon nitride.

5. The method of claim 1 wherein the amorphous silicon film is formed over at least a film comprising silicon oxynitride.

6. The method of claim 1 wherein a thickness of the crystalline silicon film is 1,000 Å or less.

7. The method of claim 1 wherein a diameter of the silicide region is 100 Å or more.

8. A method of manufacturing a semiconductor device comprising:
   forming a semiconductor film comprising amorphous silicon over a substrate;
   providing said semiconductor film with a catalyst metal having a capability of promoting crystallization of the amorphous silicon;

heating said semiconductor film and said catalyst metal to crystallize said semiconductor film wherein metal silicide regions are formed in the crystallized semiconductor film;

selectively removing said metal silicide regions from the crystallized semiconductor film by using an etchant having a sufficient etching selectivity against silicon whereby holes are formed in the semiconductor film; and then irradiating an entire surface of the crystallized semiconductor film with a laser light in order to close said holes.

9. A method according to claim 8 wherein said catalyst metal is selected from the group consisting of Ni, Fe, Co, Ru, Rh, Pd, Os, Ir, Pt, Cu and Au.

10. A method according to claim 8 wherein said semiconductor film is formed on an insulating film comprising silicon nitride over said substrate.

11. A method according to claim 8 wherein said semiconductor film is formed on an insulating film comprising silicon oxynitride over said substrate.

12. A method according to claim 8 wherein said semiconductor film has a thickness of 100 Å–1000 Å.

13. A method according to claim 8 further comprising a step of etching a surface of the semiconductor film after the irradiation of laser light.

14. A method of manufacturing a semiconductor device comprising:

forming a semiconductor film comprising amorphous silicon over a substrate;

providing said semiconductor film with a catalyst metal having a capability of promoting crystallization of the amorphous silicon;

heating said semiconductor film and said catalyst metal to crystallize said semiconductor film wherein metal silicide regions are inherently formed in the crystallized semiconductor film;

selectively removing said metal silicide regions from the crystallized semiconductor film by using an etchant comprising hydrogen peroxide, hydrofluoric acid and water whereby holes are formed in the semiconductor film; and then irradiating an entire surface of the crystallized semiconductor film with a laser light in order to close said holes.

15. A method according to claim 14 wherein said catalyst metal is selected from the group consisting of Ni, Fe, Co, Ru, Rh, Pd, Os, Ir, Pt, Cu and Au.

16. A method according to claim 14 wherein said semiconductor film is formed on an insulating film comprising silicon nitride over said substrate.

17. A method according to claim 14 wherein said semiconductor film is formed on an insulating film comprising silicon oxynitride over said substrate.

18. A method according to claim 14 wherein said semiconductor film has a thickness of 100 Å–1000 Å.

19. A method according to claim 14 further comprising a step of etching a surface of the semiconductor film after the irradiation of laser light.

20. A method of manufacturing a semiconductor device comprising:

forming a semiconductor film comprising amorphous silicon over a substrate;

providing said semiconductor film with a catalyst metal having a capability of promoting crystallization of the amorphous silicon;

heating said semiconductor film and said catalyst metal to crystallize said semiconductor film wherein metal silicide regions are inherently formed in the crystallized semiconductor film;

selectively removing said metal silicide regions from the crystallized semiconductor film by using an etchant having a sufficient etching selectivity against silicon whereby holes are formed in the semiconductor film; and then melting the semiconductor film in order to close said holes.

21. A method according to claim 20 wherein said catalyst metal is selected from the group consisting of Ni, Fe, Co, Ru, Rh, Pd, Os, Ir, Pt, Cu and Au.

22. A method according to claim 20 wherein said semiconductor film is formed on an insulating film comprising silicon nitride over said substrate.

23. A method according to claim 20 wherein said semiconductor film is formed on an insulating film comprising silicon oxynitride over said substrate.

24. A method according to claim 20 wherein said semiconductor film has a thickness of 100 Å–1000 Å.

25. A method according to claim 20 further comprising a step of etching a surface of the semiconductor film after the irradiation of laser light.

* * * * *